United States Patent
Yamane et al.

[19]

[11] Patent Number: 6,115,270
[45] Date of Patent: Sep. 5, 2000

[54] ELECTRIC POWER CONVERSION ASSEMBLY WITH CERAMIC SMOOTHING CAPACITOR

[75] Inventors: Toshinori Yamane; Hirotoshi Maekawa, both of Tokyo, Japan

[73] Assignee: Mitsubishi Denki Kabushiki Kaisha, Tokyo, Japan

[21] Appl. No.: 09/432,806

[22] Filed: Nov. 3, 1999

[30] Foreign Application Priority Data

May 18, 1999 [JP] Japan .................................. 11-137326

[51] Int. Cl.⁷ ............................................ H02M 1/12
[52] U.S. Cl. .................................... 363/40; 363/141
[58] Field of Search ............................ 363/41, 40, 141, 363/144, 131, 132

[56] References Cited

U.S. PATENT DOCUMENTS 4,673,851  6/1987  Disser ............................................ 363/41
4,725,768  2/1988  Watanabe ..................................... 323/222
5,517,397  5/1996  Quek et al. ................................... 363/41

FOREIGN PATENT DOCUMENTS 10-304680  11/1998  Japan .

*Primary Examiner*—Shawn Riley
*Attorney, Agent, or Firm*—Sughrue, Mion, Zinn, Macpeak & Seas, PLLC

[57] ABSTRACT

An electric power conversion assembly includes switching elements for converting electric power by switching, a drive circuit portion for driving the switching elements, a smoothing capacitor for suppressing fluctuations in the voltage from a direct-current power supply supplying the switching elements, and a control circuit portion for controlling the switching elements by outputting a control signal to the drive circuit portion, the smoothing capacitor including ceramic capacitors.

12 Claims, 4 Drawing Sheets

ELECTRIC POWER CONVERSION ASSEMBLY WITH CERAMIC SMOOTHING CAPACITOR

BACKGROUND OF THE INVENTION

1. Field of the Invention

The present invention relates to an electric power conversion assembly comprising switching elements for converting power by switching.

2. Description of the Related Art

FIG. 3 is a block diagram showing an electric power conversion assembly for driving an alternating-current (AC) load such as a three-phase AC motor by converting a direct-current (DC) power supply into a three-phase alternating current.

This electric power conversion assembly includes: a switching power module 1 having switching elements 2; smoothing capacitors 8 for smoothing the direct current power supply supplied to the switching elements 2; and a control circuit portion 9 for controlling the switching elements 2.

The switching power module 1 includes: switching elements 2 such as transistors, insulated-gate bipolar transistors (IGBTs) or metal-oxide semiconductor field-effect transistors (MOSFETs), etc., for converting power from a direct current to a three-phase alternating current; free-wheel diodes 3 for converting power from a three-phase current to a direct current; snubber capacitors 4 for suppressing surges generated by the switching elements 2 during switching; and a drive circuit portion 5 for driving the switching elements 2. Here, the main properties required of the snubber capacitors 4 are good frequency characteristics and film capacitors are generally used.

The smoothing capacitors 8 smooth voltage jumps, etc., by suppressing voltage fluctuations in the DC power supply 6 supplied to the switching elements 2, and since it must have a sufficiently large capacitance, aluminum-electrolyte capacitors, which easily provide large capacitance, are generally used.

The control circuit portion 9 controls the switching elements 2 by outputting control signals to the drive circuit portion 5 in the switching power module 1.

Moreover, since the drive circuit portion 5 and the control circuit portion 9 are general circuits for driving and controlling an AC load 7 such as a three-phase alternating current motor, details thereof have been omitted from the diagram.

FIG. 4 is a diagram showing the internal construction of the electric power conversion assembly in FIG. 3.

In the drawing, a module main body 30, smoothing capacitors 8, a snubber capacitor board 11 incorporating snubber capacitors 4 as a circuit, and a control circuit board 12 incorporating the control circuit portion 9 as a circuit are housed in a case 10. Generally, the module main body 30 and the smoothing capacitors 8 are electrically connected by means of a connecting plate 13 such as a copper bus bar or a copper plate using screws 14.

Furthermore, the snubber capacitor board 11 is generally disposed above the module main body 30 and is electrically connected to the DC input wiring 18 (P, N) and the AC output wiring 19 (U, V, W) using screws 14.

The module main body 30 includes: a resin portion 31 having the DC input wiring 18 (P, N), the AC output wiring 19 (U, V, W), and the drive circuit board connections 20 insertion molded therein; a base 16; an insulating substrate 17 consisting of a ceramic substrate for mounting the switching elements 2 and the free-wheel diodes 3 on the base 16; a drive circuit board 15 incorporating the drive circuit portion 5 as a circuit; and a gel filler 22 consisting of silicon gel charged between the insulating substrate 17 and the drive circuit board 15. Moreover, in some cases, the upper portion of the drive circuit board 15 is filled with epoxy resin, etc. Furthermore, the insulating substrate may be other than a ceramic substrate.

The switching elements 2 and the free-wheel diodes 3 are secured to the insulating substrate 17 which has a conductor pattern on the base 16 with an adhesive material such as solder.

The DC input wiring 18 (P, N), the AC output wiring 19 (U, V, W), and the drive circuit board connections 20 are connected to the switching elements 2 and the free-wheel diodes 3 with connecting conductors 21 such as wire bondings. Furthermore, the drive circuit board 15 and the drive circuit board connections 20 are electrically connected to each other with solder, etc.

The gel filler 22 protects the switching elements 2, the free-wheel diodes 3, and the connecting conductors 21 so that the switching elements 2 do not fail or malfunction due to moisture, dust, etc.

Furthermore, the surface of the drive circuit board 15 on the side closest to the insulating substrate 17 (the underside of the drive circuit board 15) is completely grounded and electromagnetically shielded so that the drive circuit portion 5 does not malfunction due to switching noise generated by the switching elements 2 during power conversion.

A cooling member 23 for cooling the switching elements 2 by air cooling, water cooling, oil cooling, etc., is mounted to the housing 10. Joule heat arising from the switching elements 2 passes through the insulating substrate 17 and the base 16 and is radiated externally from the cooling member 23, cooling the switching elements 2.

Moreover, details of the mounted positioning and the method of securing the control circuit board, etc., have been omitted from the diagram.

In an electric power conversion assembly of the above construction, using an electric automobile as an example, when the vehicle is started or accelerated, discharged output from the DC power supply 6, which is a battery, is converted from direct current to a three-phase alternating current to drive an AC load 7, which is a three-phase alternating current motor. Furthermore, when regenerative braking is applied to the vehicle, regenerated power from the AC load 7 is converted from three-phase alternating current to direct current and returned to the DC power supply 6.

In an electric power conversion assembly of the above construction, aluminum-electrolyte capacitors, which have a sufficiently large capacitance to smooth the DC power supply output which is to be supplied to the switching elements 2, are used for the smoothing capacitors 8, and since the internal resistance thereof is large, the generation of internal heat due to ripple voltage fluctuation differential voltage in the DC current generated by the switching elements 2 during switching increases. In order to suppress this heat generation, the smoothing capacitors 8 are cooled by the cooling member 23, and the capacitance thereof is also enlarged.

As a result, one problem has been that the surface area and volume of the smoothing capacitors 8 has been increased, increasing the overall size of the electric power conversion assembly.

Another problem has been that when aluminum-electrolyte capacitors are used, the working temperature range is narrow, and working life is shortened due to the effects of electrolyte leakage accompanying deterioration of the seals.

Furthermore, because the entire surface of the drive circuit board 15 on the side closest to the switching elements 2 (the underside) is grounded and electromagnetically shielded so that the drive circuit portion 5 does not malfunction due to radiation noise generated by the switching elements 2 within the module main body 30, a further problem has been that electronic components can only be mounted on the upper surface of the drive circuit board 15.

SUMMARY OF THE INVENTION

The present invention aims to solve the above problems and an object of the present invention is to provide a compact and highly-reliable electric power conversion assembly, and to provide a high-performance electric power conversion assembly enabling electronic components to be mounted on both sides of a drive control circuit board.

To this end, according to the present invention, there is provided an electric power conversion assembly comprising: switching elements for converting electric power by switching; a drive circuit portion for driving the switching elements; a smoothing capacitor for suppressing fluctuations in the voltage from a power supply supplying the switching elements; and a control circuit portion for controlling the switching elements by outputting a control signal to the drive circuit portion, the smoothing capacitor comprising ceramic capacitors.

According to another aspect of the present invention, there is provided an electric power conversion assembly comprising: switching elements for converting electric power by switching; a drive circuit portion for driving the switching elements; a smoothing capacitor for suppressing fluctuations in the voltage from a power supply supplying the switching elements; and a control circuit portion for controlling the switching elements by outputting a control signal to the drive circuit portion, a smoothing capacitor board mounted with the smoothing capacitor being disposed between an insulating substrate mounted with the switching elements and a drive control circuit board including the drive circuit portion and the control circuit portion, and the entire surface of one side of the smoothing capacitor board being grounded so as to protect the drive circuit portion and the control circuit portion from switching noise from the switching elements.

DETAILED DESCRIPTION OF THE PREFERRED EMBODIMENTS

Embodiment 1

Figure 1:
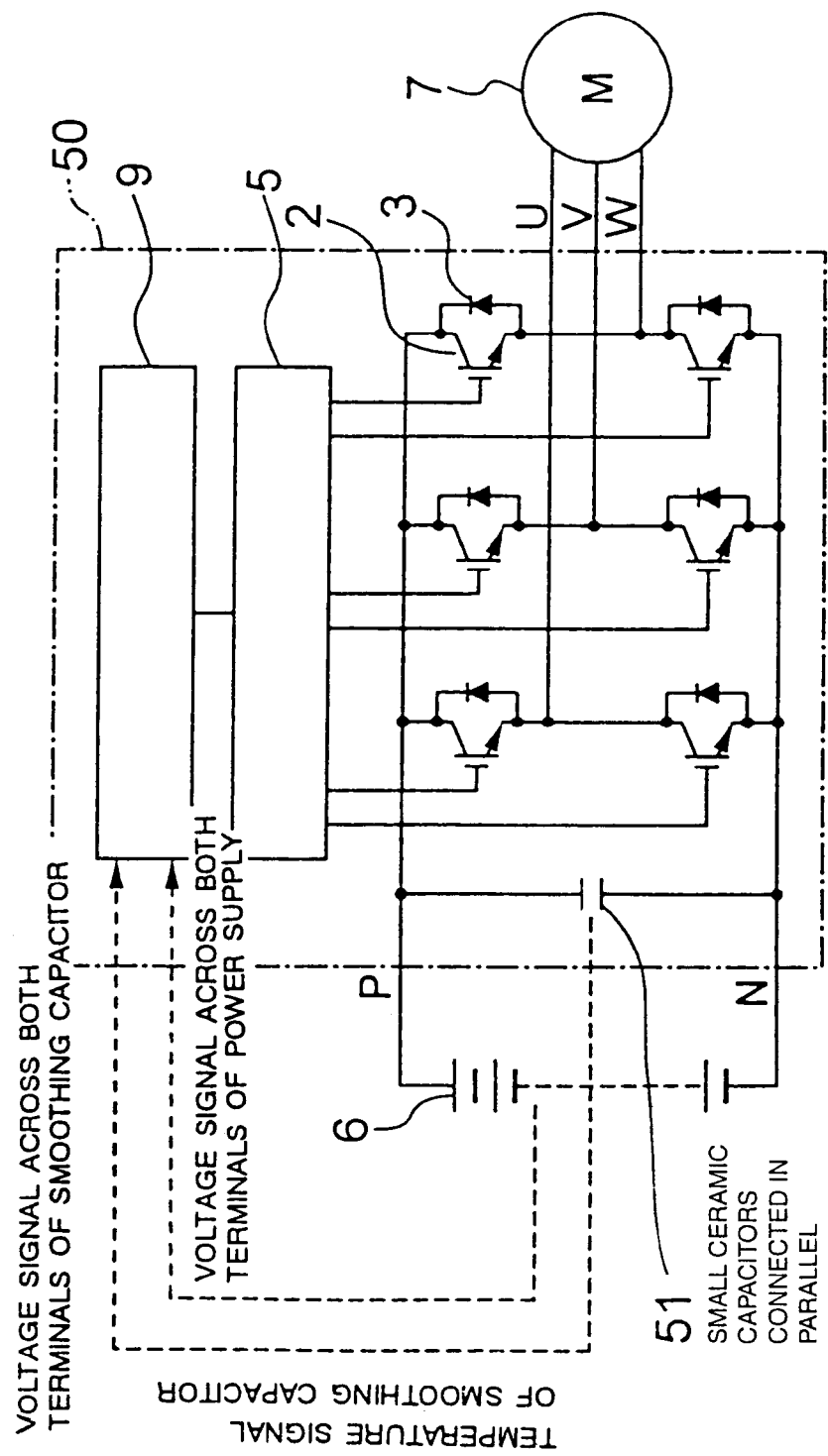
FIG. 1 is a circuit block diagram of an electric power conversion assembly according to Embodiment 1 of the present invention.

An electric power conversion assembly according to Embodiment 1 of the present invention will now be explained. Moreover, portions which are the same as or correspond to those in the conventional art described above will be explained using the same numbering.

This electric power conversion assembly includes a switching power module 50 having switching elements 2.

The switching power module 50 includes: switching elements 2 such as transistors, insulated-gate bipolar transistors (IGBTs) or metal-oxide semiconductor field-effect transistors (MOSFETs), etc., for converting power from a direct current to a three-phase alternating current; free-wheel diodes 3 for converting power from a three-phase current to a direct current; a drive circuit portion 5 for driving the switching elements 2; smoothing capacitor 51 for smoothing voltage jumps, etc., by suppressing voltage fluctuations in the DC power supply 6 supplied to the switching elements 2; and a control circuit portion 9 for controlling the switching elements 2 by outputting control signals to the drive circuit portion 5.

Moreover, since the drive circuit portion 5 and the control circuit portion 9 are general circuits for driving and controlling an AC load 7 such as a three-phase alternating current motor, details thereof have been omitted from the diagram.

Figure 2:
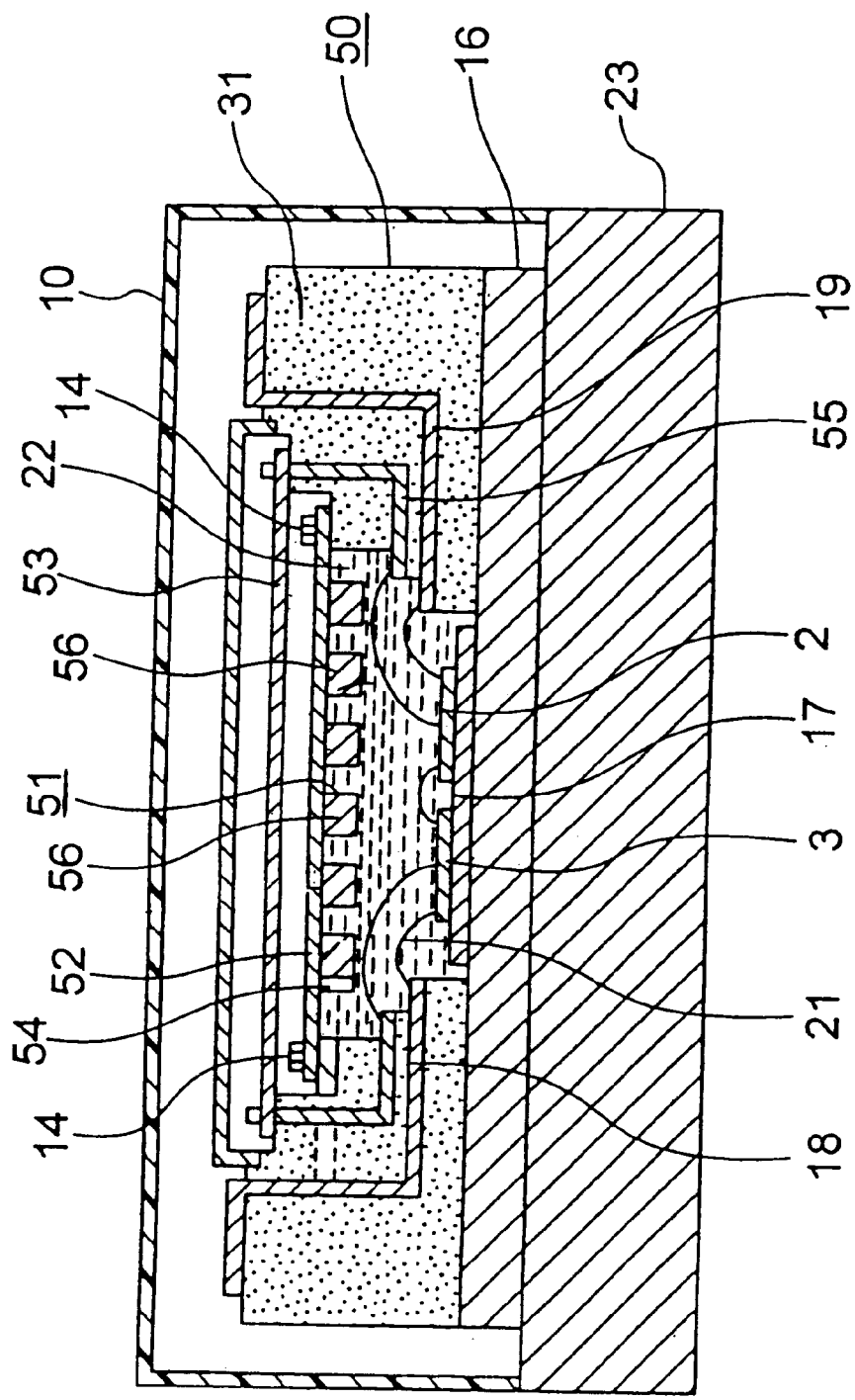
FIG. 2 is a structural diagram of the electric power conversion assembly in FIG. 1.
Figure 3:
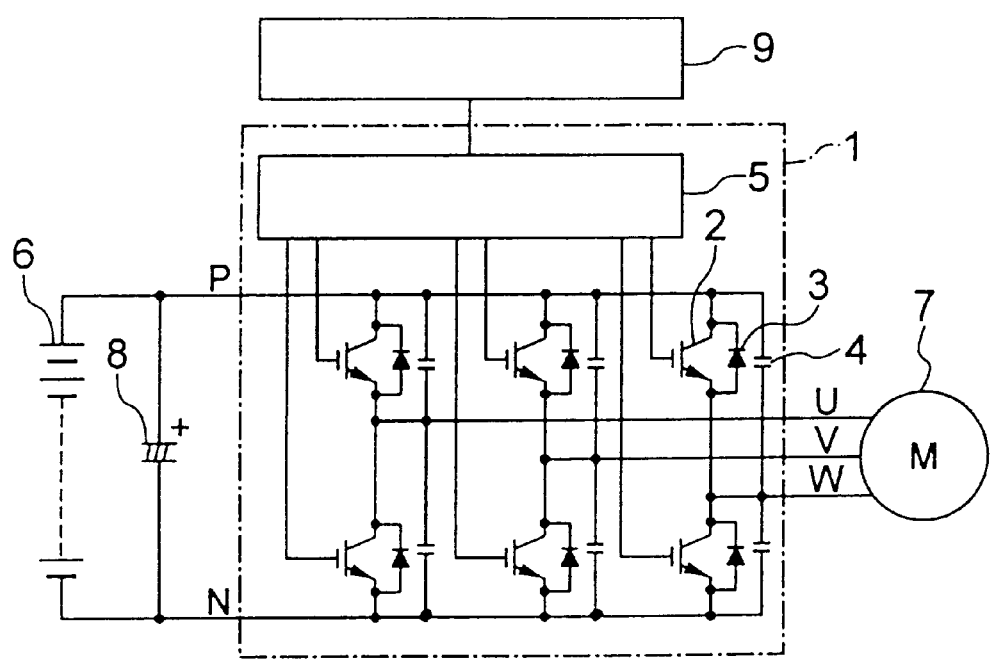
FIG. 3 is circuit block diagram of a conventional electric power conversion assembly.
Figure 4:
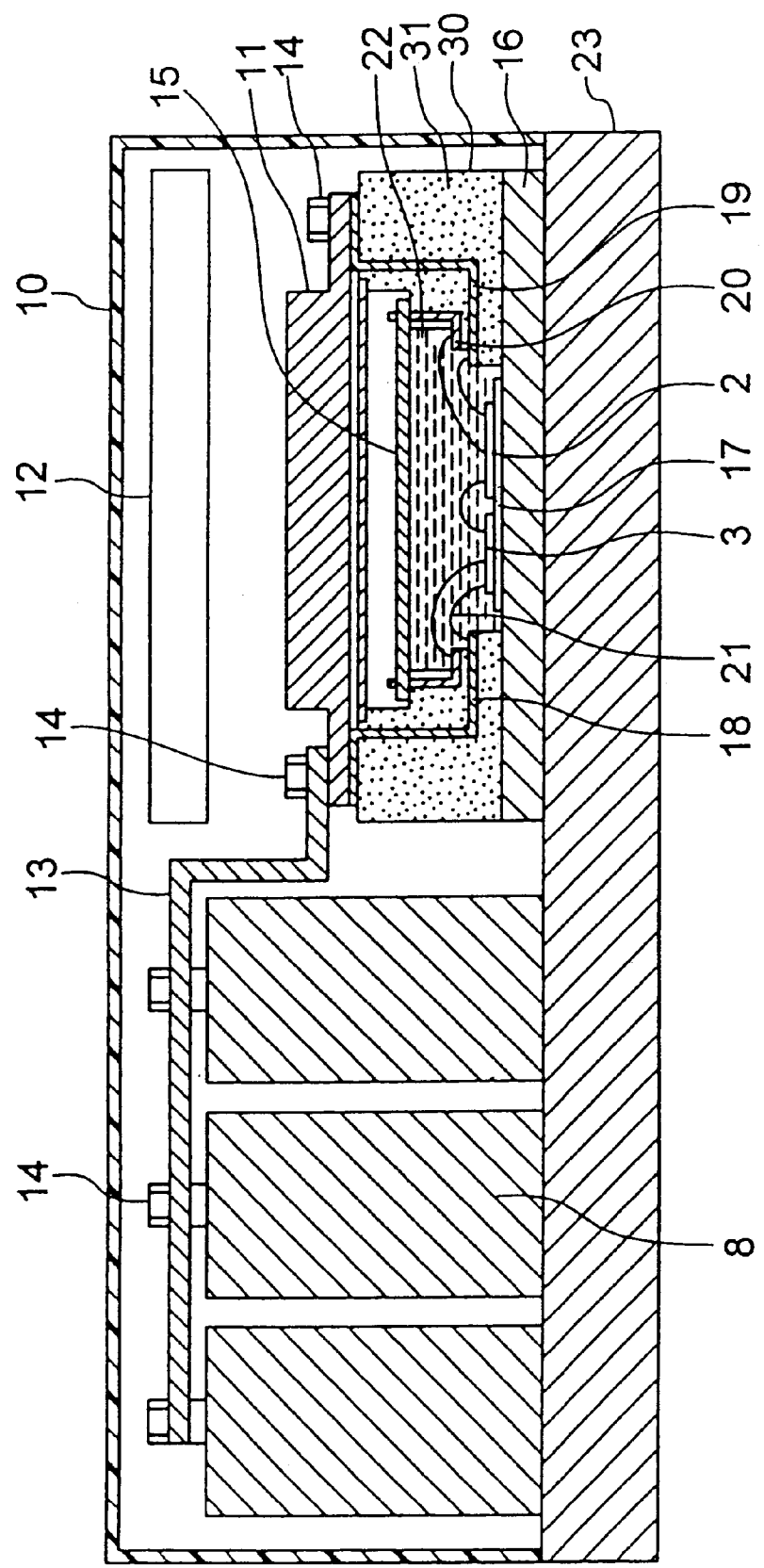
FIG. 4 is a structural diagram of the electric power conversion assembly in FIG. 3.

FIG. 2 is a diagram showing the internal construction of the electric power conversion assembly in FIG. 1.

In the diagram, the switching power module 50 inside the case includes: a resin portion 31 having DC input wiring 18 (P, N), AC output wiring 19 (U, V, W), and drive control circuit board connections 55 insertion molded therein; a base 16 composed of copper, for example; an insulating substrate 17 consisting of a ceramic substrate or the like for mounting the switching elements 2 and the free-wheel diodes 3 on the base; a drive control circuit board 53 incorporating the drive circuit portion 5 and the control circuit portion on both sides thereof; a smoothing capacitor board 52 mounted with the smoothing capacitor 51; and a gel filler 22 consisting of silicon gel charged between the insulating substrate 17 and the smoothing capacitor board 52.

In this electric power conversion assembly, using an electric automobile as an example, when the vehicle is started or accelerated, discharged output from the DC power supply 6, which is a battery, is converted from direct current to a three-phase alternating current to drive an AC load 7, which is a three-phase alternating current motor. Furthermore, when regenerative braking is applied to the vehicle, regenerated power from the AC load 7 is converted from three-phase alternating current to direct current and returned to the DC power supply 6.

The switching elements 2 and the free-wheel diodes 3 are secured to the insulating substrate 17 which has a conductor pattern on the base 16 with an adhesive material such as solder.

The DC input wiring 18 (P, N), the AC output wiring 19 (U, V, W), and the drive control circuit board connections 55 are connected to the switching elements 2 and the free-wheel diodes 3 with connecting conductors 21 such as wire bondings. Furthermore, the drive control circuit board 53 and the drive control circuit board connections 55 are electrically connected to each other with solder, etc.

A cooling member 23 for cooling the switching elements 2 by air cooling, water cooling, oil cooling, etc., is mounted to the housing 10. Joule heat arising from the switching elements 2 passes through the insulating substrate 17 and the base 16 and is radiated externally from the cooling member 23, which is composed of aluminum, cooling the switching elements 2.

The smoothing capacitor 51 includes a plurality of small ceramic capacitors 56 connected in parallel. These small ceramic capacitors 56 are mounted on the surface of the smoothing capacitor board 52 on the side closest to the insulating substrate 17. The smoothing capacitor 51 is electrically connected to the DC input wiring 18 (P, N) by means of a screw 14 securing the smoothing capacitor board 52 to the resin portion 31.

Because the ceramic capacitors 56 have an internal resistance and internal inductance approximately one tenth that of the aluminum-electrolyte capacitors used for conventional smoothing capacitors 8, the capacitance of the smoothing capacitor 51 can be reduced significantly. Furthermore, because solid dielectrics are used therein, there is no longer any concern for electrolyte leakage due to the deterioration of seals, giving them a long working life.

Furthermore, by building the smoothing capacitor 51 into the switching power module 50, the inductance of the wiring between the switching elements 2 and the smoothing capacitor 51 is reduced. By using ceramic capacitors 56 which have good frequency characteristics for the smoothing capacitor 51, surges arising when the switching elements 2 are switching can be suppressed near the switching elements 2. Consequently, the conventionally-required snubber capacitors 4 and snubber capacitor board 11 can be eliminated.

Moreover, apart from ceramic capacitors, film capacitors are also capacitors which have little internal resistance, have good frequency properties, and use solid dielectrics. However, the range of working temperatures for film capacitors is narrow, the upper limit thereof being approximately 105° C., whereas that of ceramic capacitors is generally 125° C., making it difficult to use film capacitors in high-temperature working environments such as automobiles.

Furthermore, film capacitors generally have a small capacitance per unit volume compared to ceramic capacitors, requiring them to be larger than ceramic capacitors to provide the same capacitance.

In addition to the mounting of the smoothing capacitor 51, which include ceramic chip capacitors 56 which are general-purpose surface mounted components, the smoothing capacitor board 52 serves the function of an electromagnetic shield plate for preventing the radiation noise generated by the switching elements 2 during power conversion from being transmitted to the drive circuit portion 5 and the control circuit portion 9. More specifically, an electromagnetic shielding effect is achieved by turning the entire surface on the opposite side of the smoothing capacitor board 52 from the surface mounted with the ceramic capacitors 56 into a power supply ground (N). Since this results in the possibility of installing not only the drive circuit portion 5 but also the control circuit portion 9 on both sides of the drive control circuit board 53, reductions in size and improvements in the performance of the electric power conversion assembly are made possible.

The material used in the above smoothing capacitor board may be any substance which allows the smoothing capacitor 51 to be mounted as well as being able to shut out the switching noise and prevent malfunction of the drive circuit portion 5 and the control circuit portion 9, such as glass-epoxy board with copper foil, for example.

When there is a large distance between the DC power supply 6 and the electric power conversion assembly due to the organization of the system, or when there is a need to increase the electric current di/dt regenerated from the AC current load 7, it is necessary to increase the capacitance of the smoothing capacitor 51 further. In such cases, extra ceramic capacitors can be stacked on top of the plurality of ceramic capacitors 56 already mounted on the smoothing capacitor board 52 using conductive adhesive, for example.

Furthermore, additional large capacity smoothing effects can be achieved by mounting extra a smoothing capacitor to the external lead terminals of the DC input wiring 18 (P, N) inside the switching power module 50. In that case, the type of the smoothing capacitor mounted to the external lead terminals of the DC input wiring 18 (P, N) inside the switching power module 50 is not limited to ceramic capacitors.

The smoothing capacitor 51 generates heat due to the ripple currents generated by the switching elements 2 during switching. In this embodiment, since ceramic capacitors 56 having little internal resistance are used in the smoothing capacitor 51, the self-generation of heat by the capacitors themselves is reduced compared to conventional capacitors, but the margin of the working temperature is stricter when they are used in environments with high-temperature conditions such as automobiles. In other words, in order to suppress self-generation of heat, it is necessary to increase the capacitance of the smoothing capacitor 51 further, or to cool them by some means.

In this embodiment, a gel filler 22 charged between the insulating substrate 17 and the smoothing capacitor board 52 in the switching power module 50 for protecting the switching elements 2, the free-wheel diodes 3, and the connecting conductors 21 is effectively used to cool the smoothing capacitor 51. More specifically, the smoothing capacitor 51 is cooled by transmitting the Joule heat generated by self-generation of heat by the smoothing capacitor 51 to the cooling member 23 by means of the gel filler 22 which is composed of silicon gel.

Generally, the range of working temperatures for electronic components is fixed, and they must be used within this temperature range, since using them outside this range of working temperatures, particularly on the high-temperature side, leads to failure, permanent deterioration in performance, etc. The same can be said of capacitors.

For that reason, a temperature sensor 54 is mounted to the smoothing capacitor 51, or the vicinity thereof, and the temperature sensor 54 outputs a temperature signal indicating the temperature of the smoothing capacitor 51 to the control circuit portion 9. When the temperature of the smoothing capacitor 51 exceeds a predetermined value, the smoothing capacitor 51 is prevented from overheating by the control circuit portion 9 by a method such as temporarily suppressing the powering current or the regenerated current flowing through the AC load 7. Moreover, thermistor elements, thermocouples, etc., are generally used for the temperature sensor 54 but the temperature sensor 54 is not limited to these and anything capable of measuring temperature can be used.

Furthermore, there are also limits to use from the standpoint of withstanding voltage, and use in environments which exceed this voltage also leads to failure, permanent deterioration in performance, etc. For that reason, a means is provided for outputting a signal indicating the voltage across both ends of the smoothing capacitor 51 to the control circuit portion 9, and a circuit is disposed in the control circuit portion 9 for constantly monitoring the voltage of the DC power supply 6 and the voltage across both ends of the smoothing capacitor 51. More specifically, during the regeneration operation in the AC load 7, when the voltage across both ends of the smoothing capacitor 51 is larger than the voltage of the DC power supply 6 and there is a risk that the tolerable voltage of the smoothing capacitor 51 or the switching elements 2 will be exceeded and that the elements will be damaged, the smoothing capacitor 51 and the switching elements 2 are protected from over voltage by a method such as reducing the power regenerated from the AC load 7. Moreover, methods of protection against over voltage generally include methods of voltage comparison by gate breaker circuits using comparator elements or by a program by directly inputting the voltage to a CPU, but naturally is not limited to these methods.

Moreover, in the above explanation, an inverter for driving a three-phase AC motor was used as an example, but naturally the present invention is not limited to an inverter for driving a three-phase AC motor, and can be applied to any and all types of power conversion assembly.

As explained above, the electric power conversion assembly according to one aspect of the present invention comprises the smoothing capacitor comprising ceramic capacitors. Therefore, internal resistance and internal inductance are reduced greatly compared to conventional aluminum-electrolyte capacitors, enabling the capacitance to be reduced significantly, thereby enabling the smoothing capacitor to be reduced in size, and therefore enabling the entire conversion assembly to be reduced in size. Furthermore, because solid dielectrics are used therein, there is no longer any concern for electrolyte leakage due to the deterioration of seals, improving dependability.

The electric power conversion assembly according to another aspect of the present invention comprises the smoothing capacitor board mounted with the smoothing capacitor being disposed between the insulating substrate mounted with the switching elements and the drive control circuit board including the drive circuit portion and the control circuit portion, and the entire surface of one side of the smoothing capacitor board is grounded so as to protect the drive circuit portion and the control circuit portion from switching noise from the switching elements. Therefore, the drive circuit portion and the control circuit portion are installed thereon, enabling the entire conversion assembly to be reduced in size.

Furthermore, by building the smoothing capacitor into the switching power module, the connecting plate and screw used to connect the externally-fitted smoothing capacitor to the conventional switching power module can be eliminated, enabling the assembly to be significantly reduced in size.

Furthermore, by building the smoothing capacitor into the switching power module, the inductance of the wiring between the switching elements and the smoothing capacitor is reduced, and since by using ceramic capacitors having good frequency characteristics for the smoothing capacitor, surges arising when the switching elements are switching can be suppressed, the conventionally-required snubber capacitors and snubber capacitor board can be eliminated.

According to one form of the electric power conversion assembly, the smoothing capacitor may comprise ceramic capacitors connected in parallel. Therefore, the appropriate capacitance can be easily achieved.

According to another form of the electric power conversion assembly, the smoothing capacitor may comprise ceramic capacitors stacked in layers. Therefore, the capacitance can be simply increased if there is insufficient capacitance, for example.

According to still another form of the electric power conversion assembly, the smoothing capacitor may be mounted to external lead terminals of direct-current input wiring electrically connected to the switching elements. Therefore, the capacitance can be simply increased later if there is insufficient capacitance, for example.

According to another form of the electric power conversion assembly, the smoothing capacitor may be mounted in the vicinity of the switching elements. Therefore, the inductance of the wiring between the switching elements and the smoothing capacitor can be reduced, enabling surges arising during switching to be suppressed. Thus, in addition to being able to set the DC power supply voltage higher and expand the controllable range of AC load, by suppressing jumps in the DC power supply during switching, it is possible to quicken switching speed, reduce damage to the switching elements.

According to another still form of the electric power conversion assembly, the gel filler protecting, for example, switching elements, free-wheel diodes and connecting conductors may be charged between the insulating substrate being thermally connected to an externally-exposed cooling member and the drive control circuit board such that heat generated by the smoothing capacitor is transmitted through the gel filler to be radiated by the cooling member. Therefore, the smoothing capacitor can be cooled without having to provide a new cooling construction.

According to another form of the electric power conversion assembly, the electric power conversion assembly may be provided with a temperature sensor for detecting the temperature of the smoothing capacitor such that a signal from the temperature sensor is sent to the control circuit portion for controlling the temperature of the smoothing capacitor. Therefore, failure or permanent deterioration of the smoothing capacitor due to overheating can be prevented.

According to another still form of the electric power conversion assembly, voltage signals comprising the voltage across both terminals of the smoothing capacitor and the voltage across both terminals of the power supply, respectively, may be sent to the control circuit portion which compares the voltage signals to control the voltage applied to the smoothing capacitor. Therefore, failure or permanent deterioration of the smoothing capacitor due to over voltage can be prevented.

What is claimed is:

1. An electric power conversion assembly comprising:
switching elements (2) for converting electric power by switching;
a drive circuit portion (5) for driving said switching elements;
a smoothing capacitor (51) for suppressing fluctuations in the voltage from a power supply supplying said switching elements said, smoothing capacitor comprising ceramic capacitors;
a control circuit portion (9) for controlling said switching elements by outputting a control signal to said drive circuit portion; and
a drive control circuit board (53) for mounting both said control circuit portion and said drive circuit portion, wherein said control circuit portion and said drive circuit portion are mounted on a first and a second surface of said drive control circuit board.

2. An electric power conversion assembly comprising:
switching elements for converting electric power by switching;
a drive circuit portion for driving said switching elements;
a smoothing capacitor for suppressing fluctuations in the voltage from a power supply supplying said switching elements;
a control circuit portion for controlling said switching elements by outputting a control signal to said drive circuit portion; and
a smoothing capacitor board (52) mounted with said smoothing capacitor being disposed between an insulating substrate (17) mounted with said switching elements and a drive control circuit board, said drive control circuit board providing a first and a second surface for mounting said drive circuit portion and said control circuit portion, and the entire surface of one side of said smoothing capacitor board being grounded so as to protect said drive control circuit board, said drive circuit portion and said control circuit portion from switching noise generated by said switching elements during operation.

3. The electric power conversion assembly according to claim 1 wherein a smoothing capacitor board mounted with said smoothing capacitor is disposed between an insulating substrate mounted with said switching elements and a drive control circuit board including said drive circuit portion and said control circuit portion, the entire surface of one side of said smoothing capacitor board being grounded so as to protect said drive circuit portion and said control circuit portion from switching noise from said switching elements.

4. The electric power conversion assembly according to claim 1 wherein said smoothing capacitor comprises ceramic capacitors connected in parallel.

5. The electric power conversion assembly according to claim 1 wherein said smoothing capacitor comprises ceramic capacitors stacked in layers.

6. The electric power conversion assembly according to claim 1 wherein said smoothing capacitor is mounted to external lead terminals of direct-current input wiring electrically connected to said switching elements.

7. The electric power conversion assembly according to claim 1 wherein said smoothing capacitor is mounted in the vicinity of said switching elements.

8. The electric power conversion assembly according to claim 2 wherein a gel filler is charged between said insulating substrate being thermally connected to an externally-exposed cooling member and said drive control circuit board such that heat generated by said smoothing capacitor is transmitted through said gel filler to be radiated by said cooling member.

9. An electric power conversion assembly comprising:

switching elements for converting electric power by switching;

a drive circuit portion for driving said switching elements;

a smoothing capacitor for suppressing fluctuations in the voltage from a power supply supplying said switching element, said smoothing capacitor comprising ceramic capacitors;

a control circuit portion for controlling said switching elements by outputting a control signal to said drive circuit portion;

a temperature sensor (54) for detecting the temperature of said smoothing capacitor such that a signal from said temperature sensor is sent to said control circuit portion for controlling the temperature of said smoothing capacitor.

10. An electric power conversion assembly comprising:

switching elements for converting electric power by switching;

a drive circuit portion for driving said switching elements;

a smoothing capacitor for suppressing fluctuations in the voltage frame power supply supplying said switching elements, said smoothing capacitor comprising ceramic capacitors; and a control circuit portion for controlling said switching elements by outputting a control signal to said drive circuit portion, and said control circuit portion for controlling a voltage applied to said smoothing capacitor by comparing a voltage signal from said smoothing capacitor and a voltage signal from a power supply (6).

11. The electric power conversion assembly according to claim 10 wherein said voltage signal from said smoothing capacitor is representative of the voltage applied across both terminals of said smoothing capacitor and said voltage signal from said power supply is representative of a voltage value across both terminals of said power supply.

12. An electric power conversion assembly comprising:

switching elements for converting electric power by switching;

a drive circuit portion for driving said switching elements;

a smoothing capacitor for suppressing fluctuations in the voltage from a power supply supplying said switching elements; and a control circuit portion for controlling said switching elements by outputting a control signal to said drive circuit portion; and a smoothing capacitor board mounted with said smoothing capacitor being disposed between an insulating substrate mounted with said switching elements and a drive control circuit board including said drive circuit portion and said control circuit portion; and the entire surface of one side of said smoothing capacitor board being grounded so as to protect said drive circuit portion and said control circuit portion from switching noise from said switching elements;

a gel filler being charged between said insulating substrate being thermally connected to an externally exposed cooling member and said drive control circuit board such that heat generated by said smoothing capacitor is transmitted through said gel filler to be radiated by said cooling member.

\* \* \* \* \*